United States Patent [19]
Dwire et al.

[11] B 3,991,389
[45] Nov. 9, 1976

[54] DIGITAL FREQUENCY SHIFT KEY MODULATOR

[75] Inventors: Jerold Dennis Dwire, Byron; Townsend Henry Porter, Jr., Rochester, both of Minn.

[73] Assignee: International Business Machines Corporation, Armonk, N.Y.

[22] Filed: Sept. 18, 1974

[21] Appl. No.: 507,087

[44] Published under the second Trial Voluntary Protest Program on February 17, 1976 as document No. B 507,087.

[52] U.S. Cl. .............................. 332/9 R; 332/11 R; 178/66 R; 179/2 DP; 325/30; 325/163
[51] Int. Cl.² ........................................ H04L 27/12
[58] Field of Search .................. 332/9 R, 9 T, 11 R, 332/11 D; 325/30, 163; 178/66 R, 66 A; 179/2 DP

[56] References Cited
UNITED STATES PATENTS

| | | |
|---|---|---|
| 3,600,680 | 8/1971 | Maniere et al .................. 325/163 X |
| 3,659,048 | 4/1972 | Zuerblis et al .................. 325/163 X |
| 3,668,562 | 6/1972 | Fritkin ............................... 332/9 R |
| 3,713,017 | 1/1973 | Vena ............................. 332/11 R X |
| 3,773,975 | 11/1973 | Koziol ................................ 332/9 R |
| 3,787,785 | 1/1974 | Bass .............................. 325/163 X |

*Primary Examiner*—Siegfried H. Grimm
*Attorney, Agent, or Firm*—Keith T. Bleuer

[57] ABSTRACT

A frequency shift key modulator producing sine wave output signals of different frequencies for mark (1) and space (0) signal levels on an input "send data" lead including a counter which divides the frequency of an input oscillator by different denominators for the mark and space signals and the output of which is synthesized to produce a stepped output approximating a sine wave and a final filter for smoothing the steps out of the output. In cases in which the mark and space output frequencies are approximately in the ratio of 1 to 2, a frequency divider is used for the mark output frequencies.

2 Claims, 5 Drawing Figures

DIGITAL FREQUENCY SHIFT KEY MODULATOR

BACKGROUND OF THE INVENTION

The invention relates to modems which convert digital signal levels (mark, and space signals) on a "data" lead to corresponding sine wave signals on a telephone line, and vice versa. More particularly, the invention relates to a frequency shift key modulator, which is the transmitter portion of such a modem, and provides sine wave signals of different frequencies on an output which correspond to the mark (1) and space (0) signals on a "send data" input lead.

Previous frequency shift key modulators (the transmitting portions of modems) have generally been of the analog type and have generally included a voltage controlled multivibrator which first produces a rectangular frequency shift key pulse train and filters for then filtering out the higher harmonics from the rectangular pulse train. These modems have been quite large and expensive; and, in addition, they are not voltage compatible with the new large scale integration logic technologies.

SUMMARY OF THE INVENTION

It is an object of the present invention to provide a relatively inexpensive and simple frequency shift key modulator and in particular, for accomplishing these aims, to provide a frequency shift key modulator which is principally digital in construction and function.

It is also an object of the invention to provide such an improved frequency shift key modulator which produces a plurality of sine wave "mark" outputs of different frequencies and a plurality of sine wave "space" outputs of different frequencies so that the single modulator can be used in lieu of a plurality of different prior analog type modulators.

It is a further object of the invention to provide such an improved modulator which includes digital counting means having the output of an oscillator applied as an input and providing a binary output and which includes also circuitry for utilizing this binary output to synthesize a sine wave as an output.

In a preferred form, the modulator of the invention includes a first counter having the output of an oscillator applied to it as an input, a second counter having the output of the first counter applied to it as an input and providing a digital output, a translator for utilizing this digital output and providing a series of output voltages that may be selectively added together for producing the steps of a stepped output sine wave, a weighted digital to analog converter for so adding these voltages to produce the stepped sine wave and a filter for removing the steps from the sine wave and smoothing the sine wave to produce a smooth sine wave output signal for application to a telephone line.

DESCRIPTION OF THE PREFERRED EMBODIMENT

Figure 1:
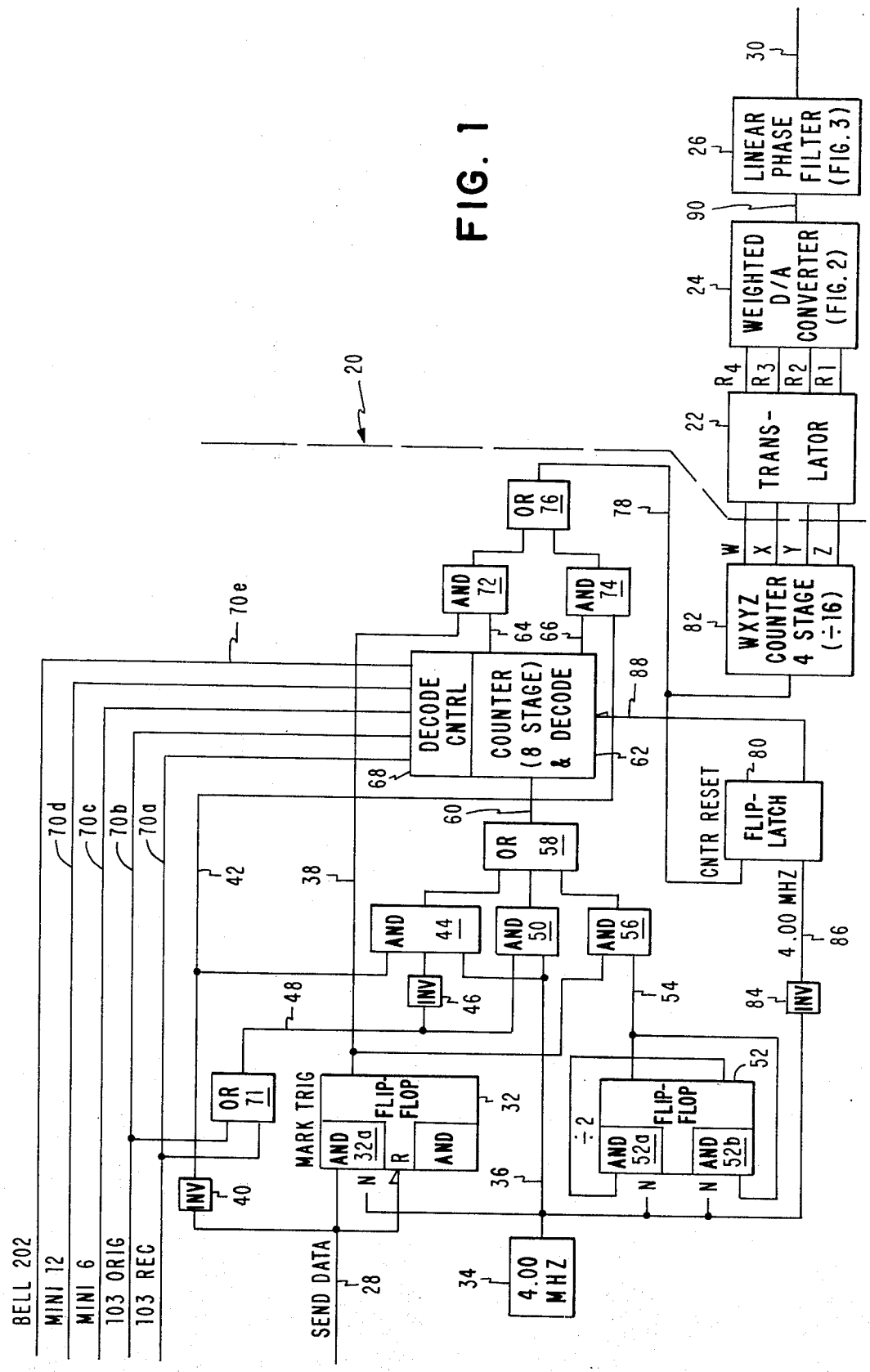
FIG. 1 is a schematic diagram of the circuit of the digital frequency shift key modulator of the invention and including a translator, a weighted digital-analog converter and a linear phase filter.

Referring to FIG. 1, the frequency shift key modulator of the invention may be seen to comprise a digital portion 20, a translator 22, a weighted digital analog converter 24 and a linear phase filter 26. A send data line 28 to which is applied different logic levels (1 or 0) constitutes the input of the digital portion 20 as well as of the frequency shift key modulator as a whole, and the output line 30 of the linear phase filter 26 also constitutes the output of the frequency shift key modulator as a whole with two sine wave frequency signals, $F_1$ or $F_2$, thereon depending upon the logic level on the send data lead 28. The line 30 is connected to a telephone line (not shown) for transmitting these sine wave frequencies to a receiving modem (not shown) on the other end of the telephone line.

The digital portion 20 of the modulator comprises a "mark trigger" flip flop 32 having the send data line 28 and the output of an oscillator 34 on a line 36 as inputs. The output of the flip flop 32 is on a line 38, and the flip flop 32 is of a type that changes state (providing a signal on line 38 when set and no signal on this line when reset) only under negative going transitions on the line 36. The signal on the send data line 28 controls the flip flop 32 and is ANDED by internal AND circuit 32a with the output of the oscillator 34 for setting the flip flop 32.

The send data line 28 is connected through an inverter 40 and a line 42 with an AND circuit 44. The inputs to the AND circuit 44 are the lines 36 and 42 and also the output of an inverter 46 that is controlled by the signal on a line 48. An AND circuit 50 has the lines 48 and 36 as inputs. A trigger or flip flop 52 has it two control terminals on internal AND circuits 52a and 52b connected to the output line 36 of the oscillator 34 and to the minus and plus outputs on lines 53 and 54 as shown so as to provide an output signal on the output lead 54 which is one half the frequency of the frequency of oscillation of the oscillator 34. An AND circuit 56 has the leads 38 and 54 as inputs.

The outputs of the AND circuits 44, 50 and 56 are connected to an OR circuit 58 and from thence by a lead 60 to an eight stage counter and decode 62. The counter and decode 62 has output lines 64 and 66 and is under the control of a decode control 68 to produce output signals on lines 64 and 66 for various counts and various numbers of input pulses applied to unit 62 from its input lead 60. The output leads 64 and 66 for unit 62 are actually connected with internal latches within unit 62, and control 68 is effective on unit 62 so that an output signal may be produced by unit 62 on its output lead 64 for 104 pulses applied on lead 60 and may produce an output signal on lead 66 for 114 pulses on input lead 60, for example. Control 68 may be under the control of signals on various inputs, such as the input leads 70a, 70b, 70c, 70d and 70e. Leads 70a and 70b constitute the two inputs to an OR circuit 71 that has lead 48 as its output.

An AND circuit 72 has the leads 64 and 38 as inputs, and an AND circuit 74 has the leads 42 and 66 as inputs. An OR circuit 76 has the outputs of AND circuits 72 and 74 as inputs and has its output line 78 connected to the set terminal of a counter reset flip latch 80 and also connected as an input to a four stage counter 82. An inverter 84 with the line 36 as its input has its output line 86 connected to the reset terminal of the latch 80, and the output of the latch 80 is connected by means of line 88 with the reset terminal of the 8 stage counter and decode 62.

The 4 stage counter 82 has W, X, Y and Z output leads connecting the counter 82 with the translator 22, and the translator 22 has $R_4$, $R_3$, $R_2$ and $R_1$ output leads connecting the translator 22 with the D/A converter 24. A line 90 connects the D/A converter 24 with the linear phase filter 26.

Figure 2:
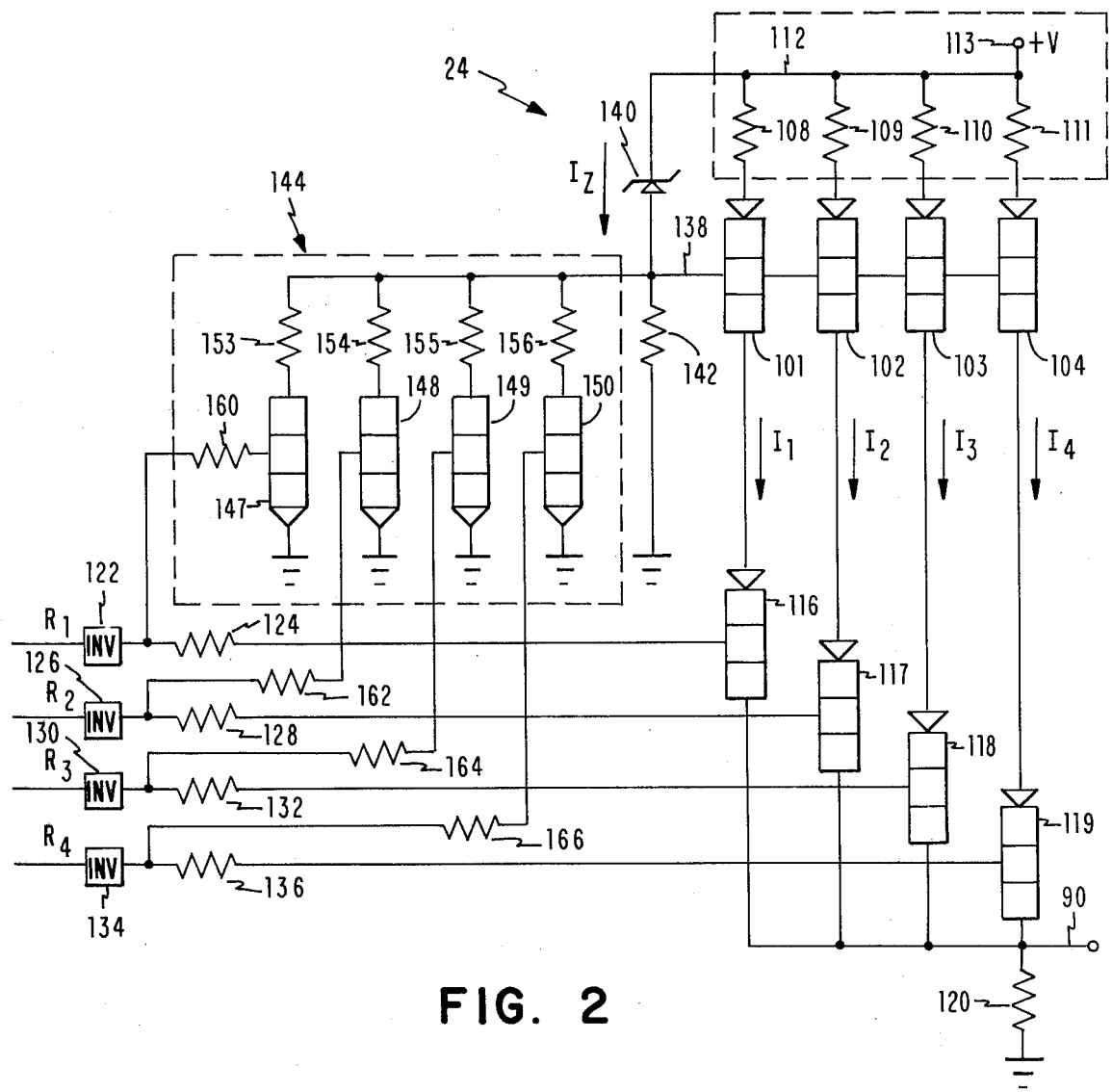
FIG. 2 is a circuit diagram of the weighted digital-analog converter.

The D/A converter 24 is shown in detail in FIG. 2 and comprises transistors 101, 102, 103 and 104 which are respectively connected in series with resistors 108, 109, 110 and 111. The resistors 108-111 are connected by means of a lead 112 with an external voltage source 113. Transistors 116, 117, 118 and 119 are respectively connected in series with transistors 101-104; and the collectors of transistors 116-119 are connected with the line 90 which constitutes the output line of the D/A converter 24. A load resistor 120 is connected between the line 90 and ground, as shown.

The lines $R_1$, $R_2$, $R_3$ and $R_4$ are the input lines to the D/A converter 24. The line $R_1$ is connected through an inverter 122 and resistor 124 with the base of transistor 116. Likewise, the line $R_2$ is connected through inverter 126 and resistor 128 with the base of transistor 117; the line $R_3$ is connected through inverter 130 and resistor 132 with the base of transistor 118; and the line $R_4$ is connected through inverter 134 and resistor 136 with the base of transistor 119.

The bases of the transistors 101-104 are connected together and to a line 138. A zener diode 140 is connected between lines 112 and 138, and a resistor 142 is connected between line 138 and ground.

A control unit 144 is connected to lead 138 and comprises transistors 147, 148, 149 and 150 respectively connected in series with resistors 153, 154, 155 and 156, all of which are connected to lead 138. The emitters of the transistors 147-150 are grounded, as shown. The transistors 147-150 are respectively controlled from lines $R_1$-$R_4$; and the outputs of the inverters 122, 126, 130 and 134 are connected through resistors 160, 162, 164 and 166 with the bases of transistors 147-150, respectively.

Figure 3:
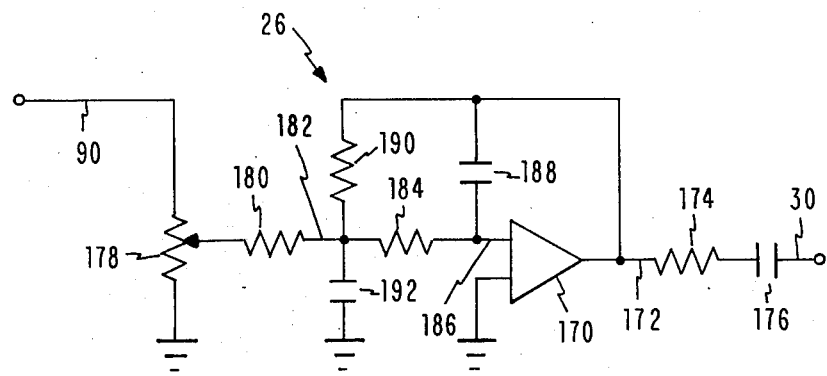
FIG. 3 is a circuit diagram of the linear phase filter.

Referring to FIG. 3, the linear phase filter 26 may be seen to comprise an operational amplifier 170 having its output lead 172 connected through a resistor 174 and a condenser 176 with the output line 30. The input line 90 of the filter 26 is connected through a rheostat 178 and a resistor 180 with a lead 182. The lead 182 is connected through a resistor 184 and a lead 186 with the operational amplifier 170. A condenser 188 is connected between leads 186 and 172, and a resistor 190 is connected between the leads 172 and 182. A condenser 192 is connected between the lead 182 and ground.

Figure 4:
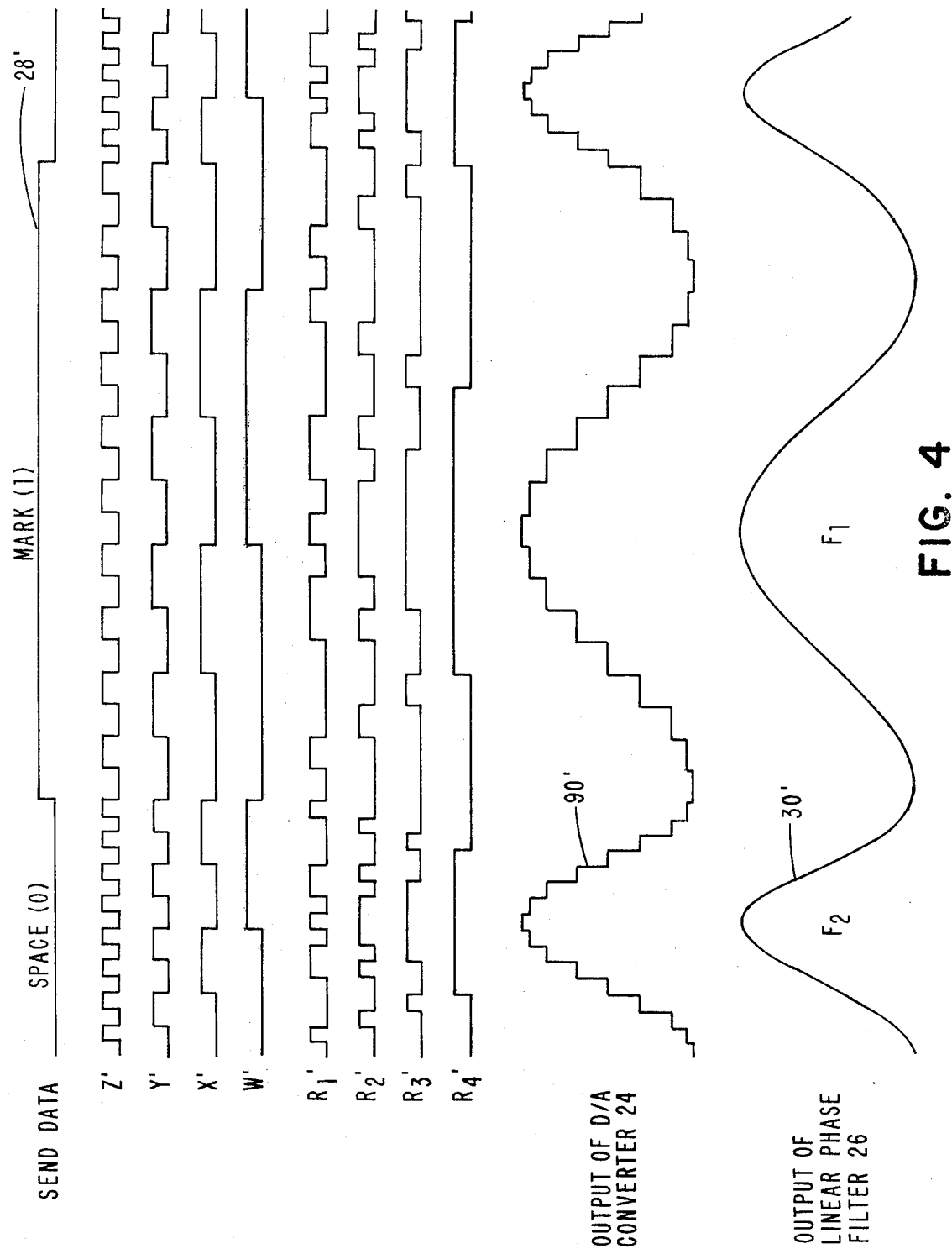
FIG. 4 is a graph showing the relationship between the mark and space signals applied to an input send data line of the modulator, the output sine wave signals of the modulator, the stepped sine wave output of the weighted digital-analog converter and the inputs and outputs of the translator.
Figure 5:
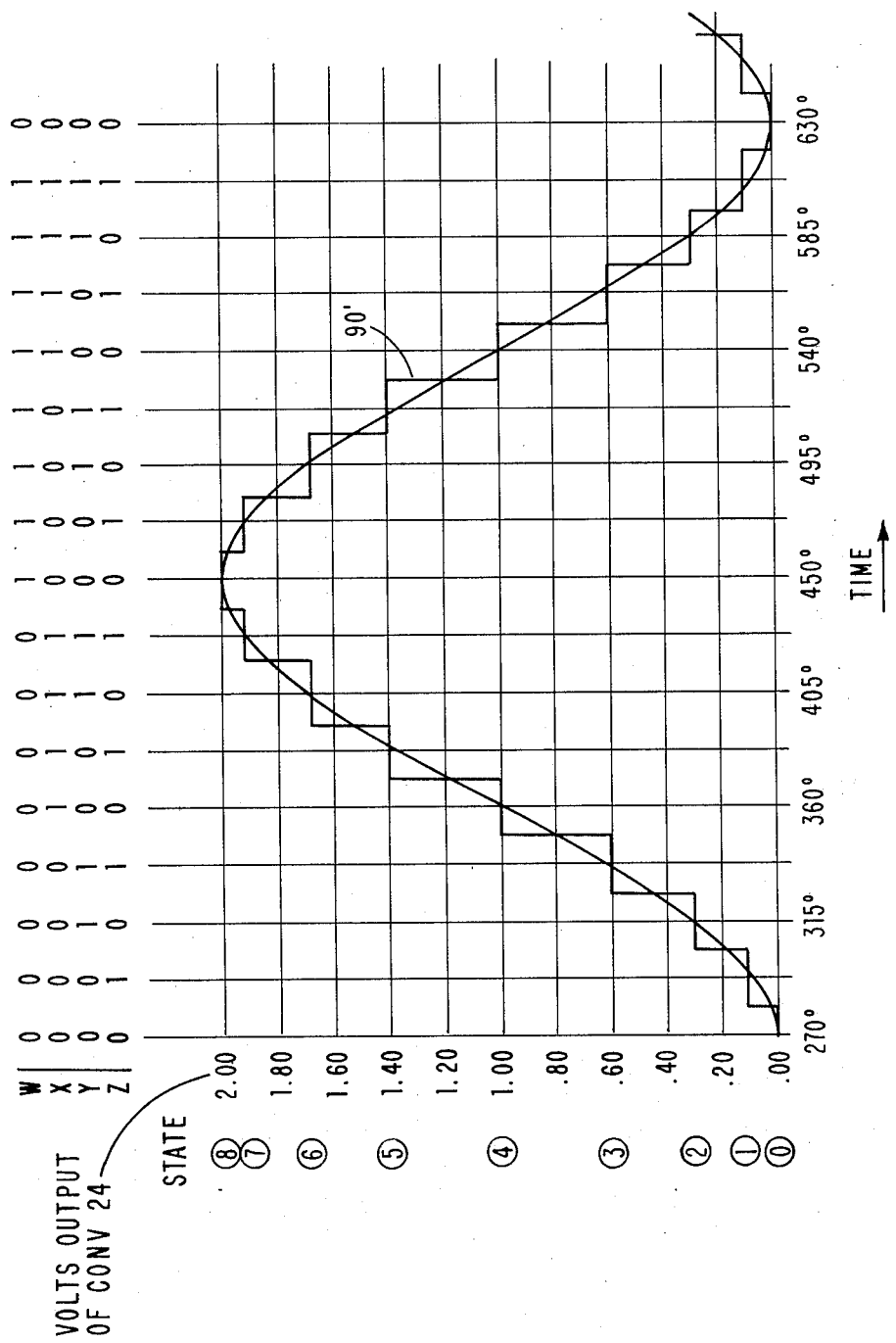
FIG. 5 is a graph showing in greater detail the stepped wave output of the weighted digital-analog converter together with the resultant filtered sine wave in relationship to each other.

In operation, the frequency shift key modulator, as shown in FIGS. 1, 2 and 3, produces sine wave signals on the output line 30 which vary in frequency as mark and space signals are applied onto the send data line 28. The 8 stage counter 62, in particular, controls the frequency of the output on line 30, and the action of the counter 62 may be controlled by raising a signal on any of the lines 70a to 70e to change the frequency of the output signal on line 30. It will be assumed initially that the frequency shift key modulator shown in FIGS. 1, 2 and 3 is set to produce the same frequencies of output as the present "Bell 202" analog modem, and a raised signal level is provided on the line 70e for this purpose. For the Bell 202 modem and for the frequency shift key modulator shown in FIGS. 1, 2 and 3, a mark (1) signal on the send data line 28 produces a sine wave signal of 1200 Hz, and a space (0) signal on send data line 28 produces a 2200 Hz signal on line 30. The frequency shift key modulator of FIGS. 1-3 thus provides an output signal 30' (see FIG. 4) on line 30 that has a decreased frequency $F_1$ for a mark signal as contrasted to an increased frequency $F_2$ for a space signal when a raised signal level is provided on line 70e. In the provision of the sine wave signals on the output line 30 of varying frequency, the four stage counter 82 is provided with pulses on the line 78 by the rest of the digital portion 20, and the counter 82 counts up in binary fashion and produces corresponding binary signals W', X', Y' and Z' on its output lines W, X, Y and Z (see FIG. 4). As the W', X', Y' and Z' signals of increasing binary weight are applied as inputs to the translator 22, the translator 22 first counts up and then counts down to zero if its output signals $R_1'$, $R_2'$, $R_3'$ and $R_4'$ on lines $R_1$-$R_4$ are considered to denote binary values. The four stage counter 82 goes through its complete cycle of 16 counts during this time. The converter 24 operates to digitally synthesize a sine wave in response to the $R_1$-$R_4$ inputs, and the output of the converter 24 is a stepped wave 90' as seen in FIGS. 4 and 5 which approximates the sine wave 30'. The linear phase filter 26 removes the steps in the curve 90' and produces the sine wave 30'.

If there is a zero or space condition on send data lead 28, the flip flop 32 is in reset condition; and the signal is therefore down on line 38. At the same time, the input to the inverter 40 is down, so that the inverter output on line 42 is up. Therefore, at this time, the AND gate 44 gates the 4.00 MHz signal from the oscillator 34 on lead 36 to OR circuit 60 and thereby to the 8 stage counter 62.

The counter 62 is a straight binary counter and produces a pulse on line 66 for every 114 periods of the oscillating signal on line 60 from oscillator 34. A raised signal exists on line 42 because of inverter 40, and AND gate 74 and OR gate 76 thus transmit the pulse occurring at the count of 114 of counter 62 to the lead 78. The pulse on line 78 sets the flip latch 80, and the latch output line 88 resets the counter 62. The inverter 84 is provided between the oscillator 34 and latch 80 so that the latch 80 is reset, thus removing the reset from the counter 62, at the proper time.

The pulse on line 78 is applied onto the four-stage counter 82 causing the counter 82 to be incremented. For every 114 counts of counter 62, with a space or zero signal existing on send data line 28, a succeeding pulse is supplied to line 78 as just described; and the succeeding pulses further increment the counter 82. The counter 82 is a straight binary counter and provides the signals on its output W, X, Y and Z leads as shown in FIG. 5, counting from 0 thru 15 in binary fashion and then to zero.

The translator 22 is of such construction as to provide the $R_1'$, $R_2'$, $R_3'$ and $R_4'$ signals on its output lines for the raising binary count in counter 82 as are indicated in the following table:

TABLE A

| STATE | VOLTS OUTPUT OF D/A CONV. 24 | OUTPUT OF TRANSLATOR 22 | | | | OUTPUT OF COUNTER 82 | | | | | | | | |
|---|---|---|---|---|---|---|---|---|---|---|---|---|---|---|
| | | $R_4'$ | $R_3'$ | $R_2'$ | $R_1'$ | W' | X' | Y' | Z' | | W' | X' | Y' | Z' |
| 0 | .000 | 0 | 0 | 0 | 0 | 0 | 0 | 0 | 0 | | | | | |
| 1 | .080 | 0 | 0 | 0 | 1 | 0 | 0 | 0 | 1 | and | 1 | 1 | 1 | 1 |
| 2 | .300 | 0 | 0 | 1 | 0 | 0 | 0 | 1 | 0 | and | 1 | 1 | 1 | 0 |
| 3 | .620 | 0 | 1 | 0 | 0 | 0 | 0 | 1 | 1 | and | 1 | 1 | 0 | 1 |
| 4 | 1.000 | 1 | 0 | 0 | 0 | 0 | 1 | 0 | 0 | and | 1 | 1 | 0 | 0 |
| 5 | 1.380 | 1 | 0 | 1 | 1 | 0 | 1 | 0 | 1 | and | 1 | 0 | 1 | 1 |
| 6 | 1.700 | 1 | 1 | 0 | 1 | 0 | 1 | 1 | 0 | and | 1 | 0 | 1 | 0 |
| 7 | 1.920 | 1 | 1 | 1 | 0 | 0 | 1 | 1 | 1 | and | 1 | 0 | 0 | 1 |
| 8 | 2.000 | 1 | 1 | 1 | 1 | 1 | 0 | 0 | 0 | | | | | |

$R_1' = .080$ volt
$R_2' = .300$ volt
$R_3' = .620$ volt
$R_4' = 1.000$ volt

As will be observed from the above table, the output of the translator 22 is a zero (binary) when the output of the counter 82 is zero (binary) The counter 82 is a binary counter, and the $W_1'$, $X_1'$, $Y_1'$ and $X_1'$ signals are binary signals. The $R_1'$, $R_2'$, $R_3'$ and $R_4'$ signals are not strictly binary signals and are simply referred to hereinafter as representing binary counts from the standpoint of convenience and simplicity in description. Both the translator 22 and counter 82 have a binary output count of 1 or a binary output count of 2 at the same time, these respectively being indicated as states 1 and 2 in the table. At the time that the content of the counter 82 is 3 binary, the output of the translator 22 goes to 4 binary, this being indicated as state 3. At the time that the content of the counter 82 goes to 4, the output of the translator in binary is 8, this being indicated as state 4. At the time that the content of the counter 82 goes to 5 in binary, the output of the translator 22 is 11 in binary, this being indicated as state 5. States 6 and 7 are as shown in the table. State 8, in which the output of translator 22 is 15 in binary, is reached when the content of the counter 82 is 8 as shown on the table. When the count in the counter 82 goes to 9 (1001 in binary), the output of the translator reduces to 14 in binary (1110), this being state 7. Likewise, as the count in counter 82 increases still further in steps of 1, the output of the translator 22 decreases in larger sized steps, as indicated in the table.

The digital to analog converter 24 produces the "VOLTS OUTPUT" on line 90 shown in the above table for each of the outputs of the translator 22 on lines $R_1$–$R_4$ shown in the table. These are the voltages 0.000, 0.080, 0.300, 0.620, 1.000, 1.380, 1.700, 1.920 and 2.000 on line 90 for states 0 to 8 respectively. These voltages may be calculated by considering the $R_1'$ signal as a voltage equal to 0.080 volt, the $R_2'$ signal as equal to 0.300 volt, the $R_3'$ signal as equal to 0.620 volt and the $R_4'$ signal as equal to 1.000 volt. The $R_1'$–$R_4'$ voltages are additive; for example, the voltage at state 6 (in which the $R_1'$, $R_3'$ and $R_4'$ signals are up) of 1.700 volts is the sum of the $R_1'$ voltage of 0.080 volt, the $R_3'$ voltage of 0.620 volt, and the $R_4'$ voltage of 1.000 volt.

The action of the converter 24 in supplying the various state 0 to state 8 voltages on the line 90 will be more completely understood by referring to FIG. 2 in which the circuitry of the converter 24 is set forth. A plus voltage level is applied onto lead 112 from the voltage source 113, and the zener diode 140 and resistor 142 provide a stable voltage on lead 138 and to the bases of transistors 101–104. The configuration of transistors 101–104 provides four independent current sources, with the resistors 108–111 respectively determining the current value ($I_1$, $I_2$, $I_3$ and $I_4$) for the respective current sources. The transistors 116–119 provide a means of switching the currents $I_1$, $I_2$, $I_3$ and $I_4$ of these respective current sources through the load resistor 120 under control of the input signals on lines $R_1$, $R_2$, $R_3$ and $R_4$. For example, if the signal on line $R_4$ is zero while raised signals exist on lines $R_1$, $R_2$ and $R_3$, transistor 119 alone conducts so that the current $I_4$ flows through the load resistor 120, producing a voltage between ground and line 90. This is the 1.000 voltalge indicated for state 4 in the above table. Likewise, a 0 signal on any of the lines $R_1$, $R_2$ or $R_3$ will cause the current $I_1$, $I_2$ or $I_3$ to flow through the load resistor 120, making it clear that the effects of the $R_1'$–$R_4'$ signals are additive. The resistors 108–111 are of such size that the voltages produced on line 90 and across load resistor 120 are 0.080, 0.300, 0.620, and 1.00, previously mentioned, for the four signals $R_1'$–$R_4'$, respectively.

The transistors 147–150 and the corresponding resistors 153–156 provide a means of compensating for inaccuracies arising from the base currents in transistors 101–104 which will change the current through and the voltage across the zener diode 140.

The stepped curve 90' is generally the form of a sine wave as shown in FIG. 5 and is the output of the D/A converter 24. Since states 0, 1, 2, 3, 4, 5, 6, 7, 8, 7, 6, 5, 4, 3, 2, 1 and 0 follow successively after each other with increasing counts of counter 82 as is clear from Table A, the full stepped sine wave 90' as shown in FIG. 5 is generated.

The effect of the linear phase filter 26 is to smooth the stepped voltage curve 90' shown in FIG. 5 so that it appears as the curve 30' on the output line 30 of the frequency shift key modulator as shown in FIGS. 1–3. For this space condition, the frequency of the sine wave signal on line 30 is 2200 Hz which is 4.000 MHz divided by 114 and further divided by 16. The division by 114 is due to counter 62, and the division by 16 is due to counter 82. FIG. 4 may be referred to for corresponding showings of the mark and space signal 28', the W'–Z' signals, the $R_1'$–$R_4'$ signals the 90' signal and the 30' signal and thus for a good understanding of the manner in which preceding ones of these signals produce succeeding ones of these signals using the equipment of FIGS. 1–3.

When a mark (1) signal exists on the send data lead 28, the flip flop 32 is thereby set. The flip flop 32 changes state only under negative going transitions of the signal from the oscillator 34. Thus, when the mark signal appears on the send data lead 28, the flip flop 32 is set at the next negative going transition of the output of oscillator 34. The trigger 52 is of the same general type as the trigger 32 and has its outputs connected to its inputs, as shown, to be free running under the control of the oscillator 34 to thus have the effect of providing an output signal on its output line 54 of one-half of 4.00 MHz or 2.00 MHz. The AND circuit 44 is degated when the mark signal appears on lead 28 due to the action of the inverter 40, and the AND gate 74 is also degated. The AND gate 56 is enabled by the output of the flip-flop 32, and the half frequency signal from trigger 52 thus passes through AND gate 56 and OR gate 58 to the 8 stage counter 62. The counter 62 thus counts only half as fast as previously for a space signal on line 28.

The output line 64 of the counter 62 has a pulsed signal appearing thereon for every 104 pulses applied onto counter 62 from input lead 60. The AND gate 72 is enabled by the signal on the lead 38 from the flip flop 32 in set condition at this time, and the pulses on the line 64 are thus passed through the AND gate 72 and OR gate 76 to the line 78. The pulses on the line 78 function as before to cause a counting action by the four stage counter 82 and to produce the output sine wave 30' due to the action of the translator 22, the D/A converter 24 and the filter 26. The frequency of the sine wave signal 30' on the line 30, for this mark condition, is however reduced from 2200 Hz to 1200 Hz, due to the fact that the half frequency signal on line 54 is applied to the counter 62 and due to the fact that the 104 count line 64 from the counter 62 is utilized in lieu of the 114 count line 66. The 1200 Hz frequency is calculated by dividing 4 MHz by 2, 104 and 16.

The frequency shift key modulator as shown in FIGS. 1–3 is capable of producing the following sine wave frequencies on the output line 30 which are applicable to the modem types indicated:

TABLE B

| Modem Type | Mark ("1") | Space ("0") |
| --- | --- | --- |
| Bell 202 | 1200 Hz | 2200 Hz |
| Mini-12 | 1300 Hz | 2100 Hz |
| Mini-6 | 1400 Hz | 2000 Hz |
| 103 Originate | 1270 Hz | 1070 Hz |
| 103 Receive | 2225 Hz | 2025 Hz |

The manner in which the frequency shift key modulator shown in FIGS. 1–3 provides the 1200 Hz and 2200 Hz mark and space signals so that the digital frequency shift key modulator shown in FIGS. 1–3 may successfully take the place of the transmit portion of the analog type Bell 202 modem has just been described. The 1300 Hz and the 2100 Hz mark and space signals for the Mini-12 application occur in the same manner, but a signal is raised on the Mini-12 line 70d in lieu of the Bell 202 line 70e. This has the effect of changing the action of the counter and decode 62 so that the unit 62 produces pulses on the lines 64 and 66 for every 96 and 119 pulses, respectively, applied an an input to the unit 62 from the line 60, these being in lieu of the 104 and 114 pulses necessary for the Bell 202 application. The 2100 Hz for a space signal on send data line 28 thus results from a division of the 4 MHz output of the oscillator 34 by 119 and by 16. The 1300 Hz signal results from a division of the 4.00 MHz output of the oscillator 34 by 2, 96 and 16. The provision of the 1400 Hz and 2000 Hz mark and space signals on line 30 by the frequency shift key modulator for the Mini-6 application is the same as for the Mini-12 and Bell 202 applications except that a signal is instead raised on the line 70c instead of the lines 70d and 70e, and this has the effect of causing the decode control 68 to produce a pulse on the line 64 for every 89 pulses of input to the unit 62 and to produce a pulse on the line 66 for every 125 pulses input on line 62 to unit 62.

It will be noted from the above Table B that the mark and space frequencies for the Bell 202, Mini-12 and Mini-6 modem types are nearly in the ratio of 1 to 2, with the space frequency being less than exactly twice that of the mark frequency. This allows the flip flop 52 producing a half frequency on its output line 54 to be used for the mark frequency, while the full frequency output of the oscillator 34 is used for the space frequency. In each case, the counter and decode 62 makes the appropriate adjustment in output so that the space frequency in each case is somewhat less than twice the mark frequency.

It will be observed from the above Table B that the 103 originate frequencies of 1270 Hz and 1070 Hz for mark and space signals are approximately the same and that the space frequency is lower than the mark frequency. The same is true of the 103 receive mark and space frequencies of 2225 Hz and 2025 Hz. The originate frequencies, incidentally, are used when a 103 modem originates a communication with another modem on the other end of the output line 30, and the 103 receive frequencies are used by the receiving modem to transmit to the originating modem.

Since the 103 originate frequencies are about the same and the 103 receive frequencies are about the same, the full 4.00 MHz output of the oscillator 34 is used for both the 103 originate and also for the 103 receive functions. In both cases, a signal is applied on line 48 which has the function of inhibiting the AND circuit 44 and enabling the AND circuit 50. The signal on line 48 is supplied from the OR circuit 71 and the 103 originate line 70b for the 103 originate condition and is supplied from the OR circuit 71 and the 103 receive line 70a for the 103 receive function. The AND circuit 50 is connected directly with the output of the oscillator 34 through the line 36, and thus the full frequency output of oscillator 34 is applied onto the counter and decode 62 through the AND circuit 50 and the OR circuit 58 for the 103 originate and receive functions.

A raised signal on the 103 originate line 70b has the effect of causing the control 68 to so control the counter and decode 62 so that a pulse is produced on the line 64 for each 197 pulses on input line 60 for a mark input signal and a pulse is produced on line 66 for every 234 pulses on input line 60 for a space input signal. Thus the space frequency of 1070 Hz on the output line 30 may be calculated by dividing 4.00 MHz by 234 and then by 16, due respectively to the counter 62 and counter 82. The 1270 Hz mark signal may be similarly calculated.

When the 103 receive line 70a has a signal raised to it, this has the effect of causing the control 68 to so control the counter 62 that a pulse is supplied to the line 64 for every 112 pulses on input line 60 and a pulse is supplied to line 66 for every 123 pulses on line 60.

The 2225 Hz mark signal and the 2025 Hz space signal on the line 30 may be calculated similarly as for the other frequencies of the mark and space signals as above described. As is apparent, for the 103 originate and 103 receive conditions, it is not necessary that the one-half frequency output of the flip flop 52 be used, since in both cases the mark and space frequencies are about the same. The space frequency in each case is slightly less than the mark frequency, and the counter and decode 62 makes adjustment for these conditions.

Concisely, the control 68 is effective to produce a pulse on lines 64 and 66 for the number of pulses on line 60, for raised signals on the control lines 70a –70e, as follows:

TABLE C

| Signal Raised On | Number of pulses on line 60 for each Pulse On: | |
|---|---|---|
|  | Line 64 (for mark) | Line 66 (for space) |
| Bell 202 line 70e | 104 | 114 |
| Mini-12 line 70d | 96 | 119 |
| Mini-6 line 70c | 89 | 125 |
| 103 orig. line 70b | 197 | 234 |
| 103 rec. line 70a | 112 | 123 |

The output frequency of 4.00 MHz is used with the counter reset latch 80 and with the mark trigger 32, incidentally, for timing purposes. The mark trigger 32, in effect, syncs the output of the oscillator 34 with the send data signal on line 28, and the inverter 84 and flip latch 80 result in a resetting of the counter 62 at an opposite half of an oscillation from oscillator 34 than that used for providing a pulse on line 60. Timing problems are thus overcome.

Advantageously, the frequency shift key modulator shown in FIGS. 1–3 is primarily of a digital type. The two counters 62 and 82 constitute digital means for dividing the frequency of the oscillator 34. Then, in order to produce output signals on line 30 which constitute sine waves and which are necessary in this form for transmission over a telephone line, the translator 32 and weighted digital-analog converter 24 are used in connection with the digital output of the counter 82 to synthesize a sine wave, (wave 90' in FIGS. 4 and 5). The linear phase filter 26 then functions to smooth the stepped sine wave so that it appears in the form of the quite accurately formed sine wave (wave 30' in FIGS. 4 and 5). The counter 62 is made to function in two different fashions, depending on whether a mark or space signal exists on the send data line 28, dividing the input on its line 60 by different denominators so that both mark and space frequencies on output line 30 may be produced. The frequency shift key modulator of FIGS. 1–3 may be used for those cases in which the space frequency is approximately twice the mark frequency; and, in these cases the output of the frequency divider flip flop 52 is used for the mark frequencies. In the cases in which the mark and space frequencies on line 30 are about the same, the full output of the oscillator 34 is used for both the mark and space output frequencies.

It will be noted particularly from FIG. 5 that the stepped wave 90' has 16 steps (one for each count in counter 82) and is thus sampled at a sampling frequency of 16 times the frequency of the sine wave 30'. Thus the wave 90' theoretically has no harmonics below the sampling frequency or 16th harmonic. The linear active filter 26 with linear phase characteristics therefore, is used to remove the 16th harmonic and thus to smooth the wave 90' into the sine wave 30'. It will be noted that the D/A converter 24 behaves as a filter that is independent of the input frequency (the rate at which the WXYZ counter 82 is incremented) and therefore performs equally well at all the frequencies that are applied to the converter 24.

The digital portion 20 of the frequency shift key modulator shown in FIGS. 1–3 results in the modem being considerably smaller and less costly than previous modems; and, in addition, the modem may be constructed of integrated circuitry so that the voltages necessary for its operation (+8.5 volts and −5 volts) are the same which the latest computers utilize. Therefore, relatively expensive converters need not be used with the modem of the present invention when a hookup is desired with the new computers. The same power supplies may be used for both the modem and also the computer. Incidentally, prior conventional modems of the analog type generally used +12 volts and −12 volts or greater for power.

In brief, the frequency shift key modulator shown in FIGS. 1–3 has the following advantages:

1. The modulator performs the modulation functions for a multiplicity of modems.
2. The modulator costs approximately one-half that of previous designs (assuming large scale integration (LSI) technology is used for the digital circuits).
3. The modulator is functionally superior to previous designs.
4. The modulator requires less power (assuming LSI).
5. The modulator requires about one-half the space of previous designs (assuming LSI).
6. The modulator is voltage compatible with the new logic families.
7. The modulator is more reliable, has a lower unit failure rate and requires about one-third the number of components required by previous designs (assuming LSI).

The translator 22, for performing the functions above described, is built in accordance with well-known principles, and these principles are set forth in the volume "Introduction To The Theory Of Switching Circuits" by E. J. McCluskey, published by McGraw-Hill Book Company, copyrighted 1968; and chapter IV of this volume in particular should be referred to in this connection. The linear phase filter 26 is also built in accordance with well-known principles, and these are set forth in the volume "Operational Amplifiers, Design And Applications" by Jerald G. Graeme, Gene E. Tobey and Lawrence P. Huelsman, PhD., as editors, published by McGraw-Hill Book Company, copyrighted 1971; and chapter VIII of this volume in particular should be referred to in this connection.

We claim:

1. A modulator for producing output sine wave signals of different frequencies to correspond with different mark and space signal levels on an input of the modulator, comprising:

an oscillator, a first counter driven by said oscillator and having a pair of outputs and being constructed so as to have a signal on a first one of its said outputs for a predetermined number of input pulses applied to it from said oscillator and to have a signal on its second output for another predetermined number of input pulses applied to it from said oscillator, a second counter having a plurality of outputs, gating means under the control of said mark and space signal levels so as to connect said first output of said first counter to said second counter on the existence of said mark signal level and to connect said second output of said first counter to said second counter on the existence of said space signal level, synthesizing means having said outputs of said second counter as inputs and effective to produce an output signal which first increases in steps and then decreases in steps that correspond with the increasing discrete counts in said second counter to thereby synthesize and produce stepped sine wave output signals, a filter having said stepped sine wave output signals applied thereto as an input and smoothing the signals to produce smooth sine wave output signals having different frequencies in accordance with the mark and space signal levels applied to the modulator, and a selectively operated control effective on said first counter for changing at least one of said predetermined number of input pulses applied to said first counter from said oscillator for each output signal on one of said outputs of said first counter so as to thereby change the relationship of the frequencies of said output signals from said filter corresponding to said mark and space signal levels.

2. A modulator as set forth in claim 1 and including:

a frequency divider driven from said oscillator; and gating means also under the control of said selectively operated control effective on said first counter for breaking a direct connection between said oscillator and said first counter and in lieu thereof completing a connection including said frequency divider from said oscillator to said first counter when a change in the predetermined number of input pulses for a signal on one of said outputs of said first counter is made.

* * * * *